United States Patent
Bryngelsson et al.

(10) Patent No.: US 10,675,983 B2
(45) Date of Patent: Jun. 9, 2020

(54) METHOD AND ARRANGEMENT FOR DETERMINING A VALUE OF THE STATE OF ENERGY OF A BATTERY IN A VEHICLE

(71) Applicants: VOLVO CAR CORPORATION, Gothenburg (SE); Volvo Truck Corporation, Gothenburg (SE)

(72) Inventors: Hanna Bryngelsson, Gothenburg (SE); Hannes Veen, Gothenburg (SE)

(73) Assignees: VOLVO CAR CORPORATION, Göteborg (SE); VOLVO TRUCK CORPORATION, Göteborg (SE)

( * ) Notice: Subject to any disclaimer, the term of this patent is extended or adjusted under 35 U.S.C. 154(b) by 408 days.

(21) Appl. No.: 15/542,969

(22) PCT Filed: Jan. 13, 2015

(86) PCT No.: PCT/EP2015/050508
§ 371 (c)(1),
(2) Date: Jul. 12, 2017

(87) PCT Pub. No.: WO2016/112960
PCT Pub. Date: Jul. 21, 2016

(65) Prior Publication Data
US 2017/0361729 A1 Dec. 21, 2017

(51) Int. Cl.
*B60L 11/18* (2006.01)
*G01R 31/389* (2019.01)
(Continued)

(52) U.S. Cl.
CPC .......... *B60L 11/1861* (2013.01); *B60L 53/00* (2019.02); *B60L 58/12* (2019.02); *B60L 58/13* (2019.02);
(Continued)

(58) Field of Classification Search
CPC .............. B60L 11/1861; B60L 11/1809; B60L 11/1857; G01R 31/3662; G01R 31/3648; G01R 31/3624
See application file for complete search history.

(56) References Cited

U.S. PATENT DOCUMENTS 6,300,763 B1 10/2001 Kwok
2003/0034780 A1* 2/2003 Vacher .................... B60L 58/10
324/427
(Continued)

FOREIGN PATENT DOCUMENTS

DE 101 58 029 A1 6/2002
EP 2 178 187 A1 4/2010
(Continued)

OTHER PUBLICATIONS

International Search Report, dated Sep. 9, 2015, from corresponding PCT/EP2015/050508 application.
(Continued)

*Primary Examiner* — Stephanie E Bloss
(74) *Attorney, Agent, or Firm* — Young & Thompson

(57) ABSTRACT

Disclosed is a method for determining a value of the state of energy of a rechargeable battery in a vehicle, the battery being connected to an electric consumer; the method including: determining the state of charge as a measure of the present capacity of the battery; and determining the state of energy as an indication of at least the remaining charge and discharge energy of the battery. The disclosed method further includes: calculating and determining the value of the state of energy based on at least one parameter which is related to the operation of the electric consumer and where the at least one parameter varies depending on a mode for operating the vehicle or electric consumer during charging or discharging of the battery. Also disclosed is an arrange-
(Continued)

ment for determining a value of the state of energy of a rechargeable battery in a vehicle.

10 Claims, 4 Drawing Sheets

(51) Int. Cl.
*G01R 31/3842* (2019.01)
*B60L 58/12* (2019.01)
*B60L 58/16* (2019.01)
*B60L 58/13* (2019.01)
*B60L 53/00* (2019.01)
*G01R 31/36* (2020.01)
*G01R 31/374* (2019.01)
*G01R 31/382* (2019.01)
*G01R 31/392* (2019.01)

(52) U.S. Cl.
CPC .......... *B60L 58/16* (2019.02); *G01R 31/3648* (2013.01); *G01R 31/389* (2019.01); *G01R 31/3842* (2019.01); *B60L 2240/545* (2013.01); *B60L 2240/547* (2013.01); *B60L 2240/549* (2013.01); *G01R 31/374* (2019.01); *G01R 31/382* (2019.01); *G01R 31/392* (2019.01); *Y02T 10/705* (2013.01); *Y02T 10/7011* (2013.01); *Y02T 10/7044* (2013.01)

(56) References Cited

U.S. PATENT DOCUMENTS

| | | | | |
|---|---|---|---|---|
| 2006/0097698 | A1* | 5/2006 | Plett | H02J 7/0014 320/118 |
| 2009/0248331 | A1 | 10/2009 | Barsukov | |
| 2012/0112754 | A1* | 5/2012 | Kawai | B60L 58/16 324/428 |
| 2014/0095060 | A1 | 4/2014 | Heo et al. | |
| 2014/0210638 | A1* | 7/2014 | Gussen | B60L 58/14 340/870.09 |
| 2015/0331055 | A1* | 11/2015 | Oi | G01R 31/367 702/63 |
| 2015/0360578 | A1* | 12/2015 | Duan | B60L 11/1861 340/455 |
| 2016/0023569 | A1* | 1/2016 | Lee | B60L 11/1861 429/50 |
| 2016/0082857 | A1* | 3/2016 | Naghshtabrizi | G01R 31/3648 701/22 |
| 2017/0067967 | A1* | 3/2017 | Bryngelsson | B60L 58/16 |
| 2017/0369048 | A1* | 12/2017 | Delobel | B60W 20/13 |
| 2018/0106867 | A1* | 4/2018 | Yun | G01R 31/3842 |

FOREIGN PATENT DOCUMENTS

| | | |
|---|---|---|
| JP | H06-189402 | 7/1994 |
| JP | 2009-044930 | 2/2009 |
| JP | 2013-169099 | 8/2013 |
| JP | 2013-243899 | 12/2013 |

OTHER PUBLICATIONS

Japanese Office Action for Application No. 2017-555829 dated May 22, 2019 with English translation provided.
Summons issued in European Patent Application No. 15 700 299.9 dated Nov. 8, 2019.
Pei et al., "Technologies for extending zinc-air battery's cyclelife: A review," Applied Energy, vol. 128, May 20, 2014, pp. 315-324.
Texas Instruments, "Battery Monitoring Basics," Oct. 2012 Dallas, Oct. 31, 2012, URL: https://training.ti.com/sites/default/files/BatteryMonitoringBasics.ppt.
Anonymous, "Battery Fuel Gauge: Factual of Fallacy?—Battery University," Dec. 16, 2011, https://batteryuniversity.com/learn/archive/battery_fuel_gauge_factual_or_fallacy.

* cited by examiner

METHOD AND ARRANGEMENT FOR DETERMINING A VALUE OF THE STATE OF ENERGY OF A BATTERY IN A VEHICLE

FIELD OF THE INVENTION

The present invention relates to a method for determining a value of the state of energy (SOE) of a rechargeable battery in a vehicle, said battery being connected to an electric consumer; said method comprising: determining the state of charge (SOC) as a measure of the present capacity of said battery; and determining said state of energy as an indication of at least the remaining charge and discharge energy of said battery.

The invention also relates to an arrangement in a vehicle for determining a value of the state of energy (SOE) of a rechargeable battery connected to an electric consumer in said vehicle; said arrangement comprising a control unit being connected to said battery and configured for determining the state of charge (SOC) as a measure of the present capacity of said battery and for determining said state of energy (SOE) as an indication of at least the remaining charge and discharge energy of said battery.

BACKGROUND ART

In the field of vehicles, there is an increase in research and development related to propulsion of vehicles with alternative power sources, i.e. power sources being used as alternatives to conventional internal combustion engines.

An internal combustion engine, for example in the form of a gasoline engine or a diesel engine, offers high efficiency with relatively low fuel consumption. However, environmental concerns have caused an increase in development of more environmental-friendly power sources for vehicles. In particular, the development of electrically operated vehicles has emerged as a promising alternative.

There exist various types of vehicle propulsion systems comprising electric machines. For example, a vehicle can be operated by means of an electric machine solely, or by means of an arrangement comprising both an electric machine and an internal combustion engine. The latter alternative is often referred to as a hybrid vehicle (HEV), and can for example be utilized in a manner in which an internal combustion engine is used for operating the vehicle while driving outside urban areas whereas the electric machine can be used in urban areas or in environments in which there is a need to limit the discharge of harmful pollutants such as carbon monoxide and oxides of nitrogen. According to known technology, electric machines are operated by means of a storage system for electrical energy arranged in the vehicle, typically in the form of a battery unit which is formed by a plurality of rechargeable battery cells and an associated control unit.

In the context of this disclosure, the term "electrically operated vehicles" refers both to pure electric vehicles and to hybrid vehicles.

Furthermore, a vehicle being operated by means of an internal combustion engine and an electric machine supplied with power from a rechargeable electrical energy storage system is often referred to as a plug-in hybrid electric vehicle (PHEV). A plug-in hybrid electric vehicle uses an energy storage system with rechargeable batteries or another suitable energy source which can be restored into a condition involving a full charge through a connection to an external electric power supply.

The technology involved in electrically operated vehicles is closely related to the development of chargeable batteries. Today, lithium-ion batteries are considered as the best battery technology for range, power, and recharging time.

For a driver of an electrically operated vehicle, it is necessary to obtain information related to the capacity of a battery. Such information can be useful for example for determining the remaining distance which can be travelled with the vehicle until the battery is discharged to such a low level that the vehicle cannot be operated. Such a remaining distance is the equivalent in an electrically operated vehicle to a distance which can be travelled with a remaining amount of fuel in a conventional vehicle having a combustion engine which is supplied with diesel or gasoline fuel.

In order to estimate the capacity of a traction battery for a vehicle, it is useful to determine the so-called state of charge (SOC) of the battery. The SOC parameter is normally expressed in percent, and corresponds to the present battery energy capacity as a percentage of its nominal capacity. The SOC can be determined by integrating the battery current over time, based on a start SOC as well as the battery capacity, which varies over time. The battery capacity can be determined by integrating the current over time and linking it to the SOC at start and finish of the integration process.

The SOC parameter is used for example to prevent overcharging of the battery, or to prevent excessive discharging, i.e. it can be used to indicate whether charging of the battery is necessary or not. For example, for a given vehicle it can be recommended to charge the battery when the SOC value has dropped to 20% during driving. Monitoring the SOC parameter is consequently important to prevent excessive discharging of the battery.

There are several ways to determine the SOC parameter. For example, there is a relationship between the SOC and its open circuit voltage, which can be established in the form of a table. This means that, according to known technology, the SOC can be estimated for example by estimating the open circuit voltage of a given battery.

Regarding known technology, it can be noted that the patent document U.S. Pat. No. 5,898,282 teaches a control system for a hybrid vehicle which is configured for calculating the state of charge (SOC) of a battery of the vehicle. The system uses input from sensors measuring vehicle speed, current and voltage levels etc. There is also provided an algorithm which detects the "current operating conditions", which could be interpreted as referring to "vehicles modes".

Although there are known methods and arrangements for determining and controlling the SOC of a battery, there are still requirements for more accurately monitoring the energy capacity of a battery, in particular for providing an understanding of how long time the battery can be used for operating a vehicle without being discharged and how long time it would take for fully charging the battery.

Such information can be used for example to determine the remaining distance for the vehicle to travel until the battery needs charging, which is vital information for a driver of such a vehicle.

SUMMARY OF THE INVENTION

It is an object of the invention to provide an improved method and arrangement by means of which the above-mentioned problems can be overcome and, in particular, by means of which a value of the state of energy (SOE) of a battery in a vehicle can be determined in a more accurate manner than previously known.

In accordance with the invention, this object is obtained by means of a method for determining a value of the state of energy (SOE) of a rechargeable battery in a vehicle, said battery being connected to an electric consumer; said method comprising: determining the state of charge as a measure of the present capacity of said battery; and determining said state of energy as an indication of at least the remaining charge and discharge energy of said battery. Furthermore, the method comprises calculating and determining said value of the state of energy (SOE) based on at least one parameter which is related to the operation of said electric consumer and where said at least one parameter varies depending on a mode for operating said vehicle or electric consumer during charging or discharging of said battery.

An advantage of the invention is that the state of energy (SOE) parameter is determined in a more optimized manner than previously known by using at least one parameter which depends on a present vehicle mode, i.e. on the actual operating conditions of the vehicle. In this manner, the SOE parameter can be determined in a more accurate manner than previously known. This also means that more precise information related to the remaining charge energy and discharge energy at the present state of charge of the battery (SOC) can be obtained with the invention. This information can for example be used for calculating the remaining range of the vehicle, i.e. the distance it may travel until it needs to be recharged.

According to an aspect, the state of energy (SOE) for charging said battery can be determined based on the state of charge (SOC) of said battery as calculated between the present state of charge (SOC*) and a highest allowed state of charge (SOCmax) for a given battery current, wherein the highest allowed state of charge (SOCmax) is dependent on said mode. Also, the state of energy (SOE) for discharging the battery can be determined based on the state of charge (SOC) of the battery as calculated between a lowest allowed state of charge (SOCmin) and the present state of charge (SOC*) for a given battery current, wherein the lowest allowed state of charge (SOCmin) is dependent on said mode.

Consequently, the state of energy (SOE) at a certain state of charge (SOC) varies depending on parameters such as—for example—the current which is applied to the battery or withdrawn from the battery and the highest state of charge (SOCmax) and the lowest state of charge (SOCmin). These parameters depend on the present vehicle mode. By using such dependency, the actual vehicle mode can be used to predict for example the current, the SOCmax and the SOCmin. In this manner, the calculation of SOE can be made more accurate than according to previous solutions. This means that it allows a more accurate calculation of the remaining distance to travel until its battery is discharged. It also allows a more accurate calculation of the required time it will take for fully charging the battery.

The above-mentioned object is also obtained by means of an arrangement in a vehicle for determining a value of the state of energy (SOE) of a rechargeable battery connected to an electric consumer in said vehicle; said arrangement comprising a control unit being connected to said battery and configured for determining the state of charge (SOC) as a measure of the present capacity of said battery and for determining said state of energy (SOE) as an indication of at least the remaining charge and discharge energy of said battery. Furthermore, said control unit is further configured for calculating and determining said value of the state of energy (SOE) based on at least one parameter which is related to the operation of said electric consumer and where said at least one parameter varies depending on a mode for operating said vehicle or electric consumer during charging or discharging of said battery.

The invention is particularly adapted for being used in a so-called hybrid vehicle, having an internal combustion engine and an electric machine which are arranged for propulsion of said vehicle. The invention can also be used in pure electric vehicles, i.e. having only electric machines for propulsion of the vehicle.

BRIEF DESCRIPTION OF DRAWINGS

The invention will now be described with reference to an embodiment and with reference to the appended drawings, wherein.

PREFERRED EMBODIMENT

Different aspects of the present disclosure will be described more fully hereinafter with reference to the accompanying drawings. The method and apparatus disclosed herein can, however, be realized in many different forms and should not be construed as being limited to the aspects set forth herein.

Figure 1:
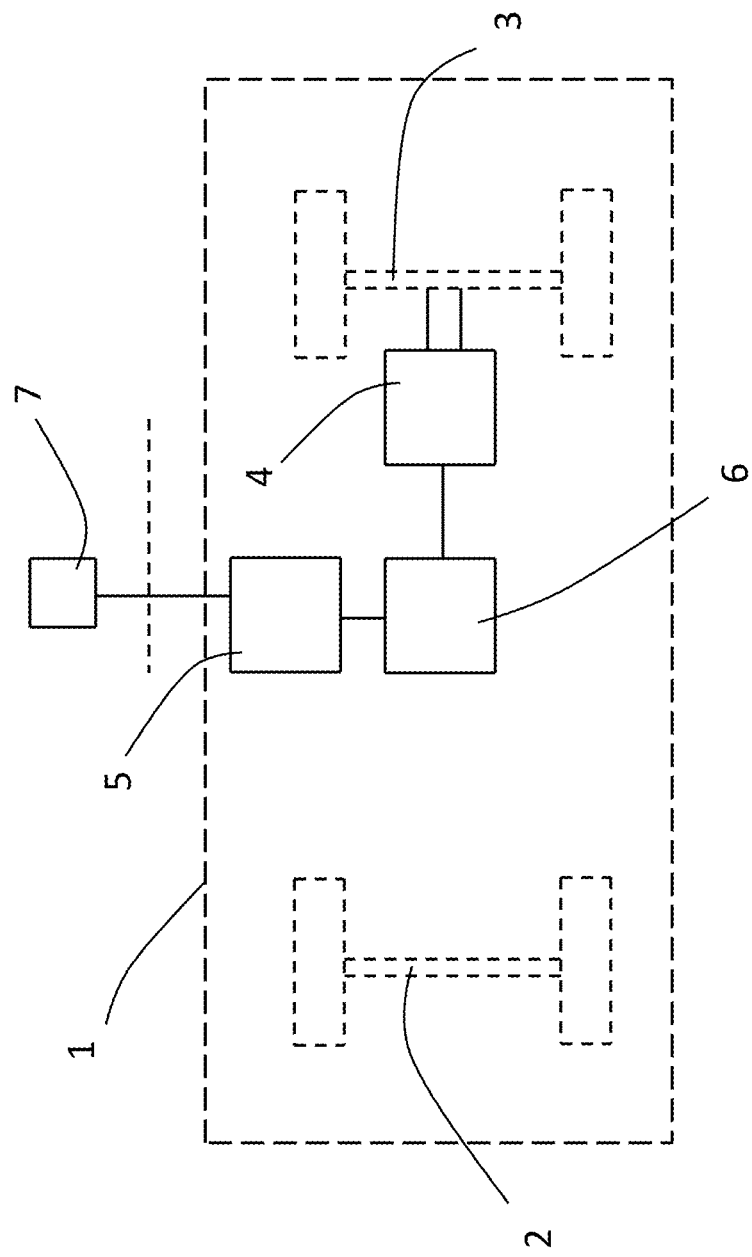
FIG. 1 shows a schematic view of an arrangement for charging an electric consumer in its most basic form.

With reference initially to FIG. 1, there is shown a simplified diagram of a vehicle 1 having a front axle 2 and a rear axle 3. The vehicle 1 is of the type which is operated by means of an electric consumer in the form of an electric machine 4. According to the embodiment, the electric machine 4 is configured so as to drive the rear axle 3. However, the invention is not limited to this embodiment only but can be applied to other types of configurations wherein an electric machine can be arranged to drive at least one vehicle axle or where one or more electric machines can be arranged to drive one or more individual wheels.

As will be discussed below, the electric machine 4 can be combined with an internal combustion engine so as to operate the vehicle 1 with either electric drive or with the combustion engine, or a combination of both.

Furthermore, the electric machine 4 is supplied with electric energy from an energy storage system in the form of a battery unit 5, which consequently is a traction battery for the electric machine 4 and which comprises a plurality of battery cells (not shown in detail in FIG. 1). According to known technology, the battery cells are connected in series in order to provide an output DC voltage with a desired voltage level suitable for driving the electric machine 4. Suitably, the battery cells are of lithium-ion type, but other types may also be used.

As shown in FIG. 1, the battery 5 and the electric machine 4 are connected to each other via a power control unit 6. Also, the battery 5 can be charged via an external charger unit 7 which is an external electric power supply to which the battery 5 can be connected when it is suitable to charge the battery 5. It can be noted that according to an aspect, the vehicle 1 is configured for regenerative braking, allowing charging of the battery 5 during braking of the vehicle 1. The principles of regenerative braking are previously known as such, and for this reason they are not described here.

As mentioned above, the state of energy (SOE) of the battery 5 provides information about the remaining charge energy and discharge energy at the present state of charge (SOC) of the battery, as well as the total energy of the battery. This principle is described in FIG. 2a, which is a diagram showing how the SOC varies with the voltage U of the battery 5. It should be noted that the SOC generally corresponds to the level of charge Q of the battery 5 and constitutes a measure of the present capacity of the battery 5 in relation to a nominal capacity of the battery 5.

Figure 2A:
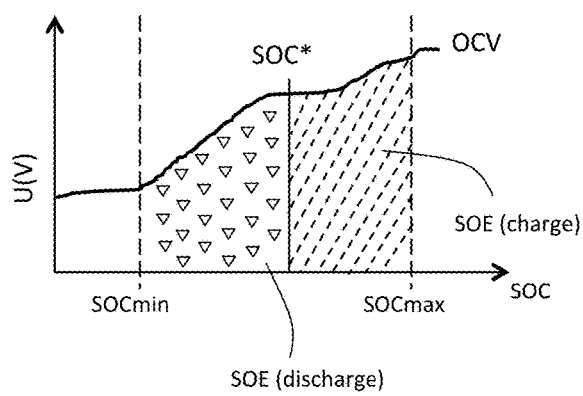
FIGS. 2a, 2b and 2c are diagrams showing the principles of determining the state of energy (SOE) according to the invention.

With reference to FIG. 2a, the state of energy (SOE) of the battery 5 can be determined as a measure of the remaining charge and discharge energy of the battery 5, i.e. the area under the curve representing the relationship between the battery voltage U and the SOC. The value of the SOE—as determined when the battery 5 has a certain SOC—varies depending on certain parameters, such as for example the resistance R of the battery 5 and also the current I which is applied to the battery 5 (during charging) or, alternatively, which is drawn from the battery 5 (during discharging). The SOE also varies depending on the highest allowed state of charge (SOCmax) and the lowest allowed state of charge (SOCmin) of the battery 5.

In this regard, SOCmax corresponds to the highest allowed state of charge of the battery 5 wherein no further charging of the battery 5 is allowed, whereas SOCmin corresponds to the lowest allowed state of charge of the battery 5 wherein the battery 5 must be charged in order to allow operation of the electric machine 4. According to the embodiment, the state of energy (SOE) of the battery 5 is determined by means of the power control unit 6 (see FIG. 1).

With reference to FIG. 2a, it should be noted that the remaining charge energy (i.e. until the battery 5 is fully charged) can be determined from the area under the SOC-curve as determined from the current SOC value (indicated as "SOC*" in FIG. 2a) and to the SOCmax value. This area is indicated by a pattern of broken lines in FIG. 2a. In a corresponding manner, the remaining discharge energy (i.e. remaining until a battery is discharged so much that it reaches the SOCmin value) can be determined as the area under the SOC-curve as regarded from the SOC* value and to the SOCmin value. This area is indicated by a pattern of small triangles in FIG. 2a.

An important principle of this disclosure is that one or more parameters which can be used to determine the SOE, such as the battery resistance R and current I, and the SOCmin and SOCmax values, will vary depending on a mode of the vehicle 1, i.e. depending on the present operating conditions of the vehicle 1 and the battery 5.

The SOE determines how much energy there is left to a fully charged battery and to a completely discharged battery, i.e. how much energy there is left to the SOCmax and to the SOCmin for a certain charge current. This energy is found by calculating the area under the SOC curve. Also, the SOCmax and SOCmin values can be dependent on the vehicle mode. This means that the SOCmax and SOCmin values, as well as the charge/discharge current, are input parameters to the SOE calculation. As a result, the present vehicle mode is an input parameter to the SOE calculation.

The term "vehicle mode" is used to indicate a mode for operating the vehicle 1 or battery 5 during charging or discharging of the battery 5. According to a first example, a first vehicle mode can be a situation in which the battery 5 is charged with an external charger unit 7 supplying a very high power during a short time, which means that the SOCmax will be lower than in a second vehicle mode in which the battery 5 is charged with a relatively low power during a longer time. In the second mode, the SOCmax will be higher than in the first mode.

According to further example, a vehicle mode can be a situation in which the battery 5 is used for supplying power to the electric machine 4 (while discharging the battery 5), wherein the discharge current is relatively high for a vehicle driving at a relatively high speed, and relatively low for a vehicle driving at a relatively low speed. Furthermore, the discharge current can be expected to be higher for a vehicle having a relatively high weight as compared with a corresponding discharge current for a vehicle having a relatively low weight.

Generally, a specific vehicle mode can be a condition involving a relatively high battery current, whereas a further vehicle mode can be a condition involving a relatively low battery current.

As further examples, the term "vehicle mode" can also be used to describe situations in which external information such as weather information or navigational information (suitably according to the GPS standard) is used to influence the magnitude of the current, resistance or SOCmin and SOCmax values.

Furthermore, the "vehicle mode" can also be used in order to calculate the nominal energy of the battery. This is obtained by setting the current to 0 A, setting the SOCmax parameter to 100% and setting the SOCmin parameter to 0%. It is also possible to calculate the nominal energy corresponding to another SOC window than 0%-100%.

Furthermore, certain other parameters also affect the calculation of the SOE parameter, such as the following parameters of the battery 5:

the cell capacity (Q(Ah));
the present state of charge (SOC);
the open circuit voltage (OCV);
the resistive and non-resistive losses;
the voltage drop (RI); and
the present temperature (T).

The term "present temperature" as mentioned above may refer not only to the present temperature but also to an expected temperature during an upcoming cycle. As a further alternative, the algorithm may use a nominal temperature, i.e. disregarding the specific present temperature, for example during calculation of the nominal energy of the battery 5.

At least the resistance and the voltage drop of the battery 5 are dependent on the vehicle mode. For this reason too, the calculation of the state of energy is dependent on the present vehicle mode.

In summary, the state of energy (SOE) can be calculated and determined based on at least one parameter which relates to the operation of the vehicle 1 or the battery 5 and where said parameter varies depending on present vehicle mode during charging or discharging of said battery 5. Different modes can consequently be used to predict parameters such as the applied or withdrawn battery current and the SOCmax and SOCmin in order to optimize the calculation of the SOE.

In this manner, it can be determined how much energy there is needed (during charging) to a fully charged battery and how much energy there is available (during discharging) to a completely discharged battery. This makes it possible to calculate a remaining travelling distance and also makes it possible to calculate the time it will take to completely recharge the battery 5. It will be also be possible to determine the total amount of energy between SOCmin and SOCmax.

Figure 2B:
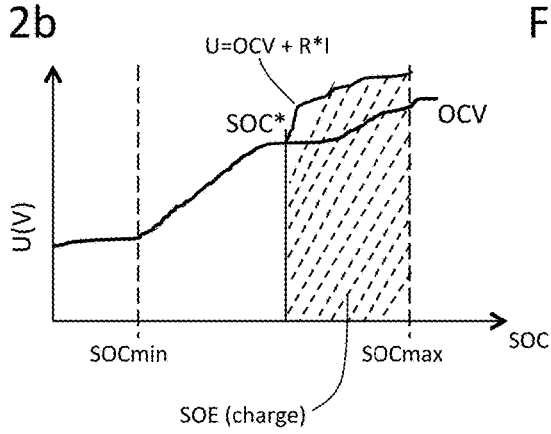

With reference to FIG. 2b, there is shown a situation which corresponds to charging of the battery 5. The energy which is required in order to charge the battery to a capacity corresponding to SOCmax is indicated by means of a number of broken lines. This particular situation takes into account a particular voltage drop (i.e. R*I, where R is the resistance over the battery 5 and I is the battery current). This means that the voltage over the battery 5 corresponds to the sum of the open circuit voltage and the voltage drop, i.e.

$$U=OCV+R*I$$

The magnitude of this voltage drop can be expected to depend on the vehicle mode, i.e. the present operation conditions of the vehicle 1 and the battery 5. Consequently, by adapting the calculation of the SOE parameter to the current vehicle mode, a more accurate estimation of the SOE can be obtained as compared with the case in which only the relationship between the battery voltage and the SOC parameter is used to determine the SOE.

Figure 2C:
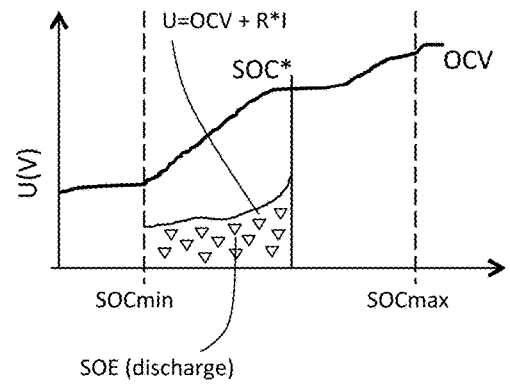

In a corresponding manner, FIG. 2c shows a situation corresponding to discharging of the battery 5, which can occur for example while the battery 5 is used to operate the electric machine 4. The energy which is used during this discharging of the battery 5 to a capacity corresponding to SOCmin is indicated as an area filled with a pattern of small triangles. This particular situation too takes into account a particular voltage drop (i.e. R*I, where R is the resistance over the battery 5 and I is the battery current) which depends on the vehicle mode, i.e. the current operation conditions of the vehicle 1 and the battery 5. Consequently, in this situation too, the SOE parameter can be determined in a very accurate manner.

Figure 3:
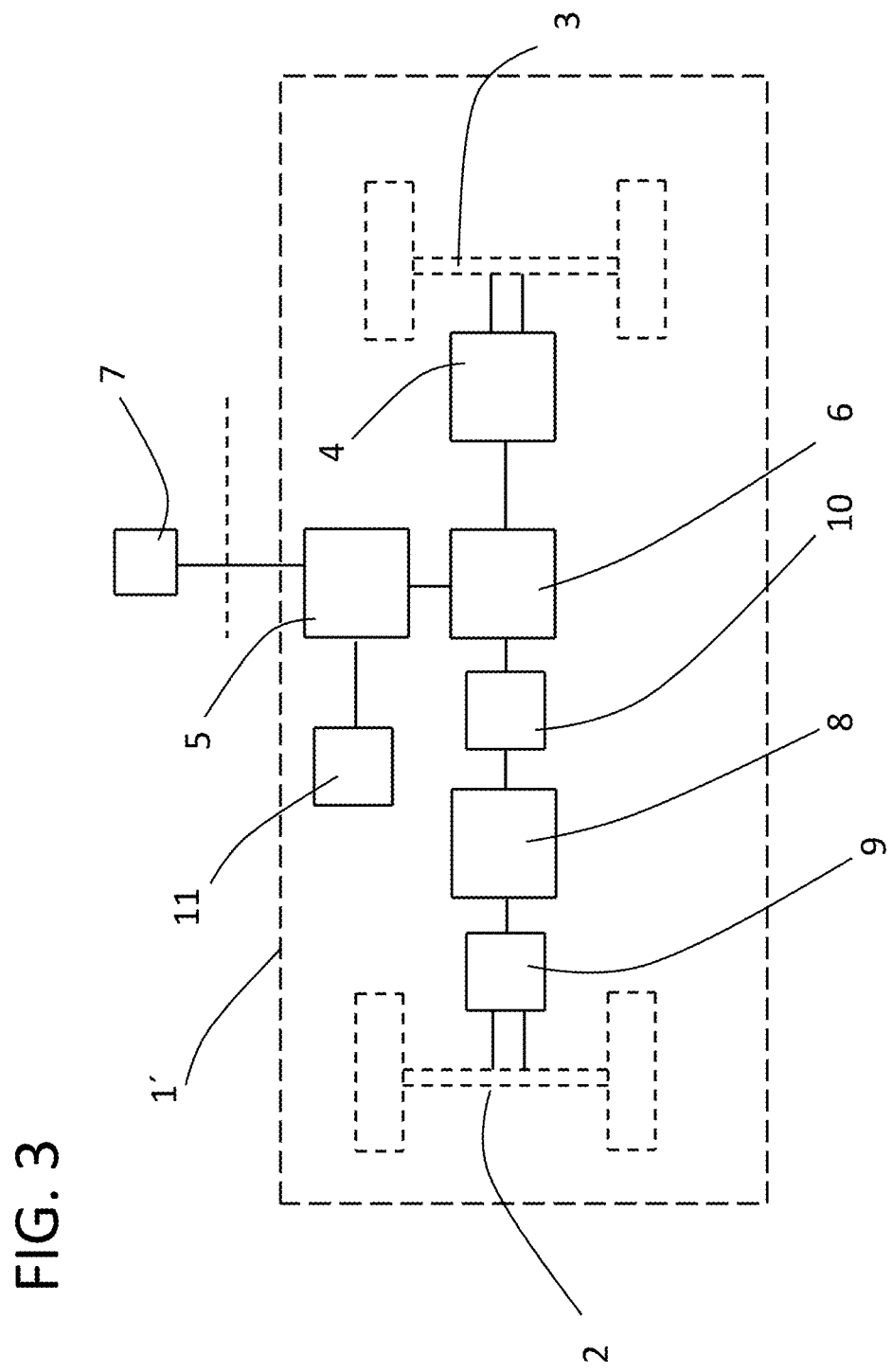
FIG. 3 is a schematic view of a further embodiment of the invention.

FIG. 3 shows a schematic drawing of a further embodiment which is an alternative to the embodiment shown in FIG. 1. The features in FIG. 1 which correspond to similar components in the embodiment in FIG. 3 are indicated with the same reference numerals. Accordingly, a vehicle 1' comprises a front axle 2 and a rear axle 3, wherein an electric machine 4 is configured for driving the rear axle 3. A battery unit 5 is connected to the electric machine 4 via a power control unit 6. Furthermore, an external charger unit 7 can be connected to the battery 5 for charging thereof.

Furthermore, the vehicle 1' shown in FIG. 3 comprises an internal combustion engine 8 which is arranged for driving the front axle 2 via a transmission 9. The internal combustion engine 8 is also associated with a generator 10. The vehicle 1' is of the plug-in hybrid type in which the combustion engine 8 can be used during certain operating conditions and the electric machine 4 can be used during certain other operating conditions. During operation of the combustion engine 8, the battery 5 is charged via the generator 10. The principles for combined operation of a combustion engine and an electric machine in a hybrid vehicle are generally known, and for this reason not described in greater detail here.

Also, further electric consumers may be used in the vehicle 1', for example in the form of auxiliary electric consumers 11 such as pumps, actuators and other electric devices. Such auxiliary electric consumers 11 are also supplied with electric power from the battery 5. According to the embodiment of FIG. 3, the electric machine 4 drives the rear axle 3 and the internal combustion engine 2 drives the front axle 2, but other alternatives for driving the axles 2, 3 are possible within the scope of the invention, for example that both the combustion engine and electric motor drive the rear axle.

During certain modes of operation of the vehicle 1', it may be suitable to use only the electric machine 3 for propulsion of the vehicle 1'. This means that the battery 5 will deliver the required power to the electric machine 4, which in turn drives the rear axle 3. During other modes of operation of the vehicle 1', for example when the state of charge of the battery 5 is determined as not being sufficient for operating the vehicle 1' by means of the electric machine 4, the internal combustion engine 8 is connected, via the transmission 9, to the front axle 2. The manner in which an electric machine and an internal combustion engine can be used for operating a vehicle is generally previously known and for this reason, it is not described in any greater detail here.

Figure 4:
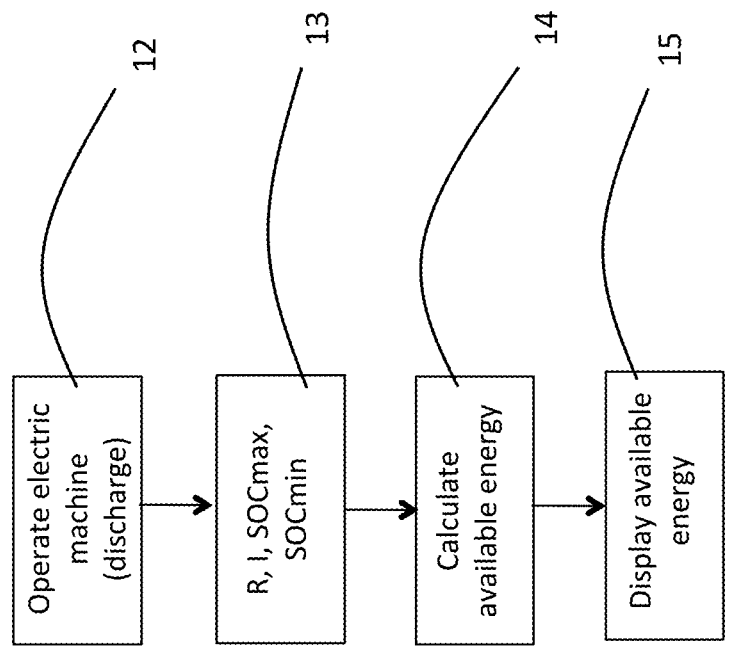
FIG. 4 is a schematic flow chart describing the principles of the invention.

FIG. 4 is a flow chart showing the principles of the invention, which shows one example of a vehicle mode, more precisely a situation involving normal operation of the electric machine 4 by means of the battery 5. This means that the battery 5 is discharged during such a phase (see step 12 in FIG. 4). During this phase, the battery current I and the resistance R are continuously measured (step 13). Also, during this phase, the SOCmax and SOCmin values are determined. These values depend on the present vehicle mode, as explained above.

Furthermore, the available energy in the battery 5 is determined based on at least the current I, the resistance R and the SOCmax and SOCmin (step 14). Finally, a measure of the state of energy, for example in the form of the available energy until the battery 5 reaches the SOCmin value, can be displayed to the driver of the vehicle (not shown) in the form of available power expressed in kW, or can be displayed to the driver as a remaining distance which can be travelled until the battery 5 needs recharging (step 15). As a further alternative, a measure of the time period which is required in order to fully charge the battery 5 could be displayed.

The invention is not limited to the embodiments described above, but can be varied within the scope of the subsequent claims. For example, the invention can be used for any type of vehicle having a chargeable energy storage system which is configured for operating an electric consumer such as an electric machine and in which there is a desire to monitor the available energy of the energy storage system.

Also, the invention can be used for virtually any type of vehicle which is operated by means of at least an electric machine. For example, the invention can be used for a hybrid vehicle, such as a plug-in hybrid vehicle, or a full electric vehicle which is operated by means of an electric machine only. Information related to the SOE can be displayed to a driver of a vehicle, in order to present information as to the range, i.e. the highest allowed distance which can be travelled with the vehicle, or other relevant information regarding the status of the battery.

The invention claimed is:

1. A method for determining a value of a state of energy (SOE) of a rechargeable battery (5) for a vehicle as an indication of at least a remaining charge and discharge energy of said battery (5), said battery (5) being connected to an electric consumer (4), said method comprising:

determining a present state of charge (S C) as a measure of a present capacity of said battery (5); and
   calculating said value of the state of energy (SOE), based on:
      determining a state of energy for charging said battery (5) as calculated between the present state of charge and a highest allowed state of charge (SOCmax) for a given battery current (I); and determining a state of energy for discharging said battery (5) as calculated between a lowest allowed state of charge (SOCmin) and the present state of charge for the given battery current (I), wherein said highest allowed state of charge (SOCmax) and said lowest allowed state of charge (SOCmin) are related to an operation of said electric consumer (4), and vary depending on a mode for operating said vehicle or electric consumer (4) during charging or discharging of said battery (5).

2. The method according to claim 1, wherein said calculating said state of energy (SOE) depend on at least one of the following battery parameters:

a cell capacity;
an open circuit voltage (OCV);
resistive and non-resistive losses;
a voltage drop (RI); and
a temperature (T);
wherein at least one of said battery parameters are dependent on said mode.

3. The method according to claim 1, further comprising:
determining a maximum remaining distance for the vehicle to travel without charging said battery (5) based on said state of energy (SOE).

4. The method according to claim 1, further comprising:
determining a time period for fully charging said battery (5) based on said state of energy (SOE).

5. The method according to claim 1, further comprising:
determining a measure of the capacity of said battery (5) of supplying electric power to auxiliary equipment (11) based on said state of energy (SOE).

6. A non-transitory computer readable medium on which is stored a computer program comprising program code which, when executed by a computer, performs the steps of claim 1.

7. An arrangement in a vehicle for determining a value of the state of energy (SOE) of a rechargeable battery (5) connected to an electric consumer (4) in said vehicle as an indication of at least a remaining charge and discharge energy of said battery (5), said arrangement comprising:

a controller (6), comprising a computer, and connected to said battery (5), said controller (6) configured to determine a present state of charge of the battery as a measure of a present capacity of said battery (5), and to calculate said value of the state of energy (SOE) by:

determining a state of energy for charging said battery (5) as calculated between the present state of charge and a highest allowed state of charge (SOCmax) for a given battery current (I), and determining a state of energy for discharging said battery (5) as calculated between a lowest allowed state of charge (SOCmin) and the present state of charge for the given battery current (I), wherein said highest allowed state of charge (SOCmax) and said lowest allowed state of charge (SOCmin) are related to an operation of said electric consumer (4), and vary depending on a mode for operating said vehicle or electric consumer (4) during charging or discharging of said battery (5).

8. The arrangement according to claim 7, wherein said battery (5) is constituted by a traction battery.

9. The arrangement according to claim 7, wherein the electric consumer (4) is an electric machine (3) for propulsion of said vehicle (1).

10. A vehicle (1) of electric vehicle type or hybrid electric vehicle type, comprising an electric machine (4) and further comprising the arrangement according to claim 7.

* * * * *